United States Patent [19]

Pirich et al.

[11] Patent Number: 4,484,995

[45] Date of Patent: Nov. 27, 1984

[54] THERMALLY CONTROLLED SPUTTERING OF HIGH ANISOTROPY MAGNETIC MATERIAL

[75] Inventors: Ronald G. Pirich, Bay Shore; David J. Larson, Jr., Huntington Station, both of N.Y.

[73] Assignee: Grumman Aerospace Corporation, Bethpage, N.Y.

[21] Appl. No.: 577,752

[22] Filed: Feb. 7, 1984

Related U.S. Application Data

[63] Continuation-in-part of Ser. No. 501,279, Jun. 6, 1983, abandoned.

[51] Int. Cl.³ .............................................. C23C 15/00
[52] U.S. Cl. ........................... 204/192 M; 204/192 R; 204/298
[58] Field of Search ................................. 204/192 M

[56] References Cited

U.S. PATENT DOCUMENTS

| | | | |
|---|---|---|---|
| 3,625,849 | 12/1971 | Rogalla | 204/192 M |
| 4,024,299 | 5/1977 | Smeggil | 427/130 |
| 4,324,631 | 4/1982 | Meckel et al. | 204/192 M |
| 4,347,086 | 8/1982 | Chraplyvy | 204/192 M |
| 4,347,112 | 8/1982 | Togami | 204/192 M |
| 4,367,253 | 1/1983 | Arai et al. | 204/192 M |

OTHER PUBLICATIONS

Egorov et al., Chem. Abst. 86 (1977), #164379g.
Hirono et al., Chem. Abst. 95 (1981), #125141.
Zhang et al., Chem. Abst. 95 (1981), #107508k.
Chem. Abst. 10th Collective Index, pp. 15034–15037, 27816–27817.

*Primary Examiner*—Arthur P. Demers
*Attorney, Agent, or Firm*—Morgan, Finnegan, Pine, Foley & Lee

[57] ABSTRACT

A substrate coating of a ferromagnetic alloy of a rare earth-transition element mixture is prepared by a hollow cathode sputtering deposition method to produce near single domain films on various substrates.

12 Claims, 2 Drawing Figures

COMPARISON OF ROOM TEMPERATURE MAGNETIC HYSTERESIS FOR SmCo₅ FILMS MEASURED PARALLEL & PERPENDICULAR TO THE FILM PLANE—HIGHER ANISOTROPY IN MAGNETIZATION FOR THERMALIZED CASE DEMONSTRATES ENHANCED IN-PLANE ALIGNMENT

THERMALLY CONTROLLED SPUTTERING OF HIGH ANISOTROPY MAGNETIC MATERIAL

This application is a continuation-in-part application of application Ser. No. 501,279, filed June 6, 1983, now abandoned.

BACKGROUND OF THE INVENTION

This invention relates generally to a columnar or ordered array near single domain magnetic composite film system. More particularly, it relates to the production of a near single domain rare earth-transition element system having improved permanent magnet properties due to improved and controllable alignment of the easy axis of magnetigation via thermalized sputtering, presence of an aligning magnetic field during sputter deposition and multiple sputtering sources to control film stoichiometry. The prior art describes numerous techniques which employ transition metal-rare earth metal compounds or alloys in constructing high performance permanent magnets. For example, such magnets have been prepared by traditional powder metallurgy techniques or by casting methods. Magnets produced by these techniques are characterized by inherent shortcomings.

More recently, improved magnetic properties were attained by using various sputter techniques in which thin films of rare earth-transition metal materials were deposited on various substrates. Even though improved properties resulted, such techniques still fell short of providing a near single domain system with a large aspect ratio whose easy axis of magnetism is well defined, i.e. either parallel to or perpendicular to the major axis and whose growth direction is such that it will allow the permanent magnet properties to approach near theoretical maximum limits. Moreover, the utilization of such materials with the above properties in concert with highly permeable but soft magneto-crystalline force materials, like iron for example, can offer significant manufacturing as well as application advantages over existing rare earth-cobalt permanent magnets.

It is an object of the present invention to provide such a system.

SUMMARY OF THE INVENTION

Accordingly, this invention involves a method of coating a substrate with a magnetic material composed of a ferromagnetic alloy of a rare earth-transition element mixture which comprises hollow cathode sputtering multiple sources of the component elements of a ferromagnetic alloy of a rare earth transition element mixture at a temperature of from 200° C. to 1000° C. in an inert atmosphere whose pressure can be varied from 10 to 150 microns onto a substrate which is surrounded by a static magnetic field to provide a coating thickness on said substrate of from 0.1 microns to 100 microns.

In a narrower embodiment, the aforesaid method makes use of a ferromagnetic alloy selected from $SmCo_5$, $Sm_2Co_{17}$ mixtures thereof, i.e., Sm, Co and $SmCo_5$, Co or a mixture of $Sm_2Co_{17}$, and Sm.

In another narrower embodiment, the aforesaid method uses a ferromagnetic alloy selected from $SmFe_5$, $Sm_2Fe_{17}$, Sm, Fe mixtures thereof or a mixture of Sm Fe and Fe and Sm.

In another embodiment, this invention is concerned with the coated substrate obtained thereby, namely, a hollow cathode-sputtered substrate coating composed of a ferromagnetic alloy of a rare earth-transition element mixture, said coating having a thickness of from 0.1 microns to 100 microns, and having been formed at a deposition rate of from 1 micron/hr to 50 microns/hr, said coating having a grain size of less than 2 microns, preferably about 1 micron.

The rare earth-transition element system just described, and particularly the samarium-cobalt system provides specific manufacturing and application advantages over existing rare earth-cobalt magnets such as:

a. it provides grains of effective diameter and length that will perform as near magnetic single domains;

b. it eliminates grinding, pressing and sintering operations;

c. it avoids non-uniformity of particle shapes;

d. it eliminates the need to aliign particles in an external magnetic field;

e. it avoids spontaneous ignition problems encountered in grinding, pressing and sintering powders of the dimensions commensurate with near magnetic single domain behavior;

f. it eliminates strain induced by grinding particles;

g. it eliminates the need to anneal final product to reduce strain;

h. it eliminates the oxidation problem associated with product annealing;

i. it significantly increases dynamic applications since recoil energy will be nearly maximized and avoidance of oxidation and subsequent decomposition will allow use at elevated temperatures, i.e., equal or greater than 250° C.

With respect to magnetic characteristics in comparison to existing permanent magnets, the presently claimed system provides the following improvements:

i. up to a 40% increase in saturation magnetization;
ii. up to a 70% increase in remanent induction;
iii. up to a 170% increase in static energy product;
iv. up to a 300% increase in dynamic energy product or useful recoil energy;
v. a significant increase in intrinsic coercivity;
vi. maximizes the set of characteristics for differing applications by changing the chemistry and/or morphology of the composites, e.g., by coupling the resulting films with the high magnetization saturation of soft magnetic substrate materials like Fe or Co-Fe, to achieve systems of moderate energy products and very large remanent induction essential in motor applications.

DETAILED DESCRIPTION OF THE INVENTION

Figure 1:
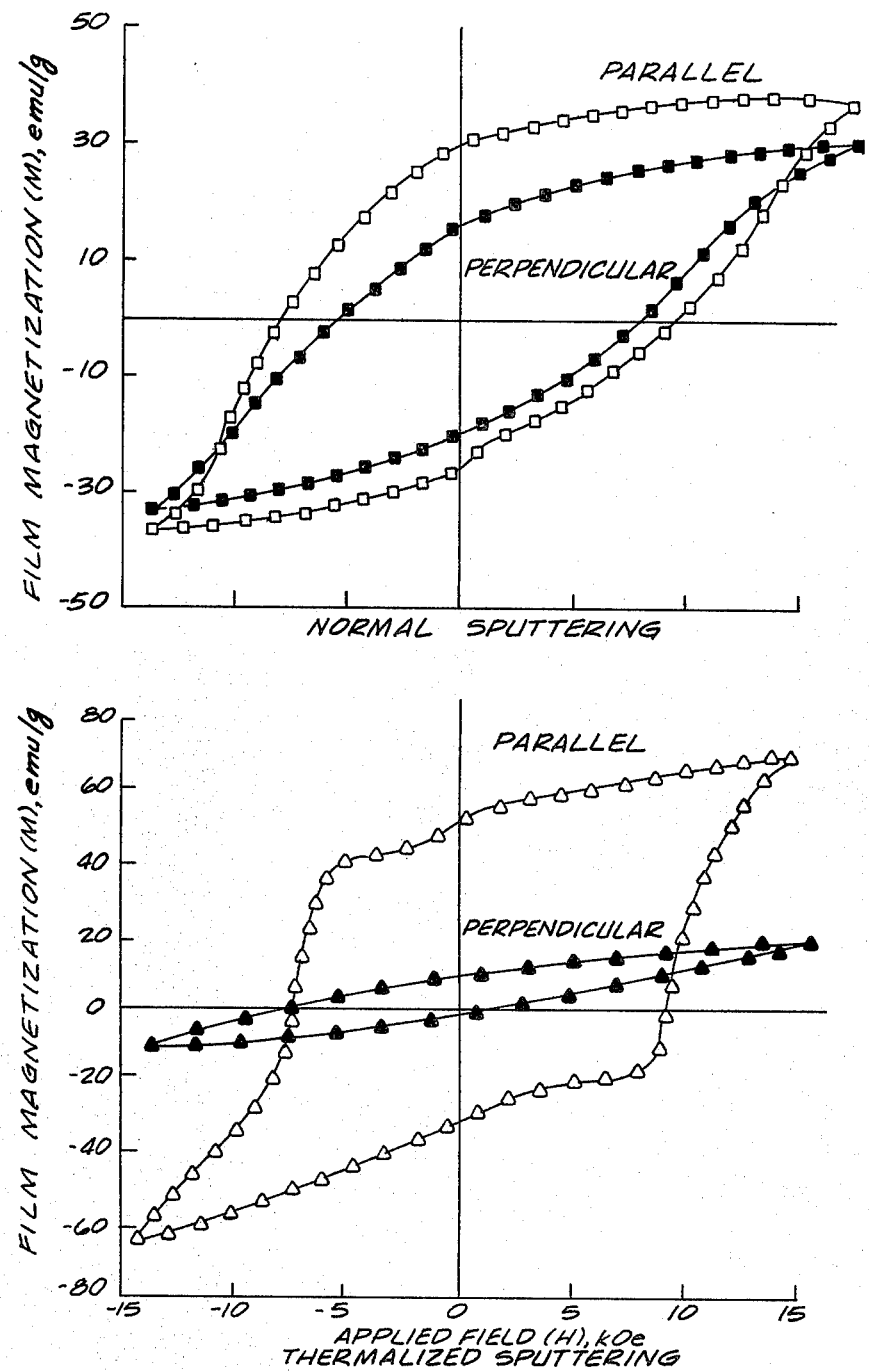
FIGS. 1 and 2 are graphs useful in explaining the operation of the present invention.

The well-known technique termed hollow cathode sputtering is employed herein to deposit the single domain columnar or ordered array polycrystalline grains onto substrates which may be magnetic or non-magnetic, depending on the intended application. Since the growth direction of the deposited grains can be made normal to the surface of the substrate (and thus the easy axis of magnetization and major axis of the grains), complex magnetic geometries can be grown by the appropriate fabrication of substrate material.

Certain important processing factors are associated with the hollow cathode sputtering technique disclosed herein. By controlling the temperature of the substrate for example, it has been demonstrated that the areal size of the deposited grains can be varied from the submicron regime ($\geq 0.2$ microns) up to about 2 microns. Since the critical size necessary for single domain behavior lies within the range 0.5–2 microns, it is possible to achieve single domain behavior composite materials disclosed herein. In addition, by controlling the rate of Sm, Co and SmCo5 sputtering and the targets (sources) to substrate distances, a continuum of compositions ranging from $Sm_2Co_2$ to $Sm_2Co_{17}$ can be achieved.

In the present method, the rate of deposition can be effectively controlled. Multiple film depositions can also be incorporated to control the thickness of the film and therefore, the bulk or total magnetization by varying the volume (and hence mass) of the near single domain grains.

The ferromagnetic alloy of a rare earth-transition element mixture employed in the present invention is comprised of a rare earth component, e.g., Sm, La, Ce, Pr, Nd, Pm, Eu, Gd, Tb, Dy, Ho, Er, Tm Yb and Lu and a transition element component such as Mn, Fe, Co and Ni. Preferred systems are Sm-Co and Sm-Fe.

Preferred Sm-Co systems include $SmCo_5$, $Sm_2Co_{17}$, mixtures thereof and a mixture of $Sm_2Co_{17}$ and Co.

Preferred Sm-Fe systems include $SmFe_5$, $Sm_2Fe_{17}$, mixtures thereof and a mixture of $Sm_2Fe_{17}$ and Fe.

The sputtering process of the present invention is carried out at a temperature in the range of 200° C. to 1000° C., preferably about 500°–600° C. for Sm-Co and Sm-Fe systems and under an inert atmosphere, preferably, an argon gas atmosphere. Other suitable inert gases include neon, helium, etc.

By this process, a coating thickness of from 0.1 microns to 100 microns is obtained. In one preferred embodiment, a thickness of 2 microns is obtained. The grain size of the substrate coating is less than about 2 microns, and preferably, about 1 micron.

The deposition rate of the aforedefined sputtering process is from 1 micron/hr to 50 microns/hr.

The sputtering process employs a pressure in the range of from 10–200 microns. 10 microns produces out-of-plane alignment for $SmFe_5$ while 150 microns produces in-plane alignment for $SmCo_5$.

The substrate material is suitably selected from copper, aluminum, aluminum oxide, iron, titanium or glass. The container which houses the substrate is typically fabricated of a copper block and contains resistive heaters embedded therein to maintain the aforesaid substrate temperature or indirectly heated by, e.g., quartz lamps. Preferably, the substrate holder is configured in a static magnetic field which produces in-plane or out-of-plane magnetic alignment.

The ability to deposit aligned, magnetic composite materials in an ordered array according to the herein disclosed method enables the growth of near single domain particles, the shape of the near magnetic single domains to be long magnetically isolated fibers, and the near alignment of all near single domain structures along the growth direction.

EXAMPLE I

The inventive method claimed herein is exemplified by the following procedure which employs a hollow cathode sputtering system (Sloan Company, Model S-310 Sputter Gun) housed within a vacuum system which employs a permanent magnet.

The substrate is mounted onto a copper block which is heated to 800° C. The copper block substrate holder is mounted between the pole faces of a Alnico permanent magnet which produces only an out-of-plane magnetic flux of 3 kg.

Figure 2:
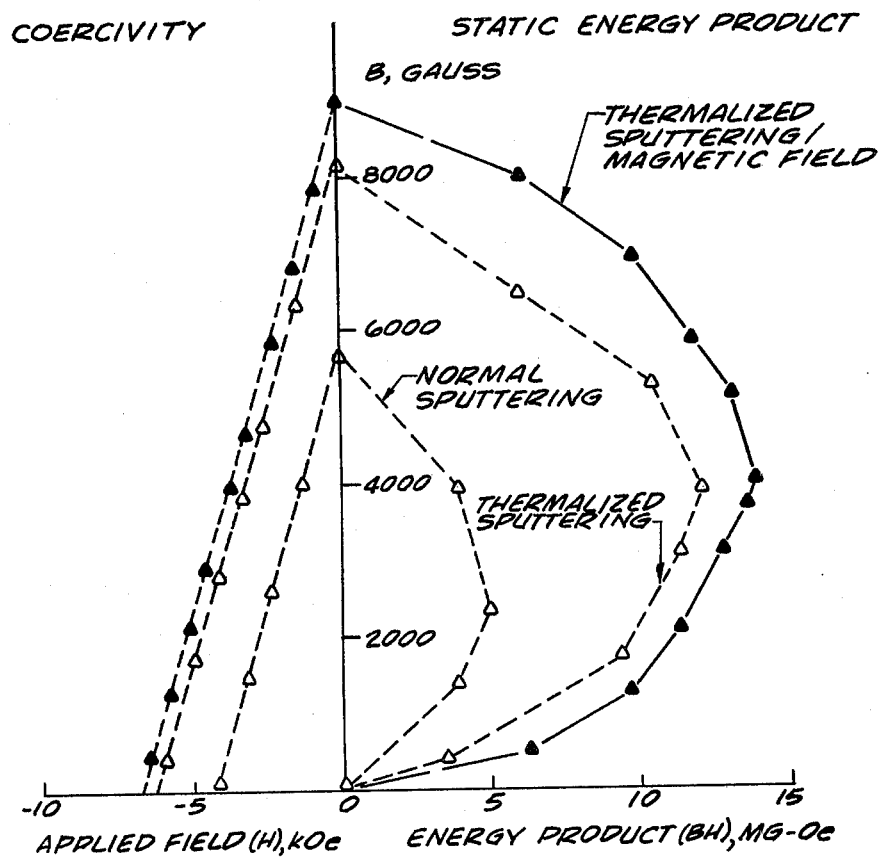

By the use of a sputtering gas pressure of 150 microns of argon gas and a target composition of 1:1:1 by weight $SmCo_5$, Co and Sm and a rate of deposition of 5 micron/hr, one produces an aligned in-plane 5 micron thick film deposited onto a 25 mil thick $Al_2O_3$ substrate. Samples from the Sm-Co system was synthesized by RF-sputtering from three colinear targets comprised of Sm, Co and $SmCo_5$ (1:1:1 by weight) onto heated $Al_2O_3$ substrates so that a narrow composition gradient was produced along the length of each substrate. Substrate temperatures were varied from 25° to 900° C. The films, about 2 microns thick, were examined by X-ray diffraction and fluorescence to determine single phase regions. Small subregions of a desired phase were then sectioned for magnetization measurements. The sputtering system base pressure was maintained near $10^{-9}$ torr, and liquid nitrogen cooled gettering shrouds were further employed during sputtering to control and minimize contaminants. For certain experiments, a static magnetic field was applied during deposition by mounting the substrate on a permanent magnet which produced only an in-plane field of about 2 kOe. Sputtering gas pressures between 50 and 150 mtorr Ar were investigated. In the lower pressure region of 50 mtorr, the sputtered atoms were highly energetic while in the upper pressure region of 150 mtorr, the sputtered atoms, through collisions with the sputtering gas ions, were thermalized. FIG. 1 shows the effect of varying the gas pressure from 50 to 150 microns on the in and out of plane magnetic hysteresis. FIG. 2 shows the improved permanent magnetic performance in terms of residual magnetization, demagnatization and static energy product when the Ar pressure changes from 50 to 150 microns and when an in-plane, static magnetic field of 2 kOe is further employed.

EXAMPLE II

The procedure of Example I is repeated except that the following alloys are used in place of the $Sm_2Co_{17}$, Co mixture:
$SmCo_5$, Sm, Co
$Sm_2Co_{17}$, Sm,Co
$Pr_2Co_{17}$, Pr,Co
$Nd_2Co_{17}$, Nd,Co

EXAMPLE III

The procedure of Example I is repeated using a $Sm_2Fe_{17}$ plus Fe plus Sm mixture (1:1:1 by wt) instead of the $Sm_2Co_{17}$ plus Co plus Sm mixture with the following processing modification: the pole faces of an Alnico permanent magnet produces only an out-of-plane magnet flux of 3 kg.; an Ar sputtering gas pressure of 10 microns is used; and the substrate temperature is 900° C.

EXAMPLE IV

The deposited film on the substrate as obtained in Example I is characterized by the following microstructural properties:

1. polycrystalline aligned columnar type grains where the growth direction of the grains is normal to the surface of the substrate (out-of-plane) with diameters on the order of a micron;

2. the easy axis of magnetization lies along the major axis of the grains (out-of-plane).

EXAMPLE V

The deposited film on the substrate as obtained in Example III is characterized by the following microstructural properties:

1. polycrystalline aligned columnar type grains where the growth direction of the grains is normal to the surface of the substrate (out-of-plane) with diameters on the order of a micron;

2. the easy access of magnetization lies perpendicular to the major axis of the grains (in-plane).

It should be understood by those skilled in the art that various modifications may be made in the present invention without departing from the spirit and scope thereof as described in the specification and defined in the appended claims.

What is claimed is:

1. A method of coating a substrate with a magnetic material composed of a ferromagnetic alloy of a rare earth-transition element mixture which comprises hollow cathode sputtering a ferromagnetic alloy of a rare earth-transition element mixture from multiple sources, wherein each component of said mixture is sputtered from one of said multiple sources, at a temperature of from 200° C. to 1000° C. in an inert atmosphere onto a substrate to provide a coating thickness on said substrate of from 0.1 microns to 100 microns.

2. The method of claim 1 wherein said sputtering is effected at a deposition rate of from 1 micron/hr to 50 microns/hr.

3. The method of claim 1 wherein the particle size of said substrate coating is less than about 2 microns.

4. The method of claim 1 wherein said inert atmosphere is provided by a gas selected from the group consisting of argon, helium, or neon or a suitable mixture of said inert gases.

5. The method of claim 1 wherein said hollow cathode sputtering is effected in a hollow cathode sputtering apparatus which employs a pressure in the range of from 10 microns to 200 microns, inert gas or mixture of inert gases.

6. The method of claim 1 wherein said substrate is contained in a substrate holder comprised of copper block having resistive heaters embedded therein.

7. The method of claim 6 further comprising containing said substrate holder in a static magnetic field which produces in-plane or out-of-plane magnetic alignment.

8. The method of claim 1 wherein said substrate is selected from copper, aluminum, aluminum oxide, titanium, glass or a transition metal element such as iron, Mn, Co, and Ni.

9. The method of claim 1 wherein said ferromagnetic alloy is selected from a mixture of $Sm_2Co_{17}$ and Co and Sm and produced at an Ar pressure of 150 microns.

10. The method of claim 9 wherein said substrate temperature during processing is maintained in the range of 900° C.

11. The method of claim 1 wherein said ferromagnetic alloy is selected from a mixture of $SmFe_{17}$ and Fe and Sm and produced at an Ar pressure of 10 microns.

12. The method of claim 11 wherein said substrate temperature during processing is maintained in the range of 800°–900° C.

* * * * *

Disclaimer 4,484,995.—*Ronald G. Pirich*, Bay Shore; *David J. Larson, Jr.*, Huntington Station, both of N.Y. THERMALLY CONTROLLED SPUTTERING OF HIGH ANISOTROPY MAGNETIC MATERIAL. Patent dated Nov. 27, 1984. Disclaimer filed Jan. 9, 1990, by the assignee, Grumman Aerospace Corporation.

Hereby enters this disclaimer to the remaining term of said patent.
[ *Official Gazette April 24, 1990* ]